United States Patent
Okada

(10) Patent No.: US 9,160,073 B2
(45) Date of Patent: Oct. 13, 2015

(54) ANTENNA DEVICE

(75) Inventor: Hiroki Okada, Toyota (JP)

(73) Assignee: TOYOTA JIDOSHA KABUSHIKI KAISHA, Toyota-shi (JP)

(*) Notice: Subject to any disclaimer, the term of this patent is extended or adjusted under 35 U.S.C. 154(b) by 1209 days.

(21) Appl. No.: 13/000,968

(22) PCT Filed: Apr. 30, 2009

(86) PCT No.: PCT/IB2009/005430
§ 371 (c)(1),
(2), (4) Date: Dec. 22, 2010

(87) PCT Pub. No.: WO2009/156805
PCT Pub. Date: Dec. 30, 2009

(65) Prior Publication Data
US 2011/0134003 A1   Jun. 9, 2011

(30) Foreign Application Priority Data

Jun. 27, 2008   (JP) ................................. 2008-168642

(51) Int. Cl.
*H01Q 9/00* (2006.01)
*H01Q 9/04* (2006.01)
*H01Q 9/30* (2006.01)
*H01Q 23/00* (2006.01)
(Continued)

(52) U.S. Cl.
CPC ........... *H01Q 9/0407* (2013.01); *H01Q 9/0442* (2013.01); *H01Q 9/30* (2013.01); *H01Q 23/00* (2013.01); *H03J 3/185* (2013.01); *H03K 17/60* (2013.01); *H04B 1/0458* (2013.01)

(58) Field of Classification Search
CPC .............. H01Q 1/38; H01Q 1/50; H01Q 1/18
USPC .................................................. 343/745, 850
See application file for complete search history.

(56) References Cited

U.S. PATENT DOCUMENTS 6,054,965 A    4/2000  Yamamoto
6,628,931 B1   9/2003  Tomida
(Continued)

FOREIGN PATENT DOCUMENTS

EP   1 168 495   1/2002
EP   1 387 435   2/2004
(Continued)

OTHER PUBLICATIONS

International Search Report issued Sep. 21, 2009 in PCT/IB09/05430 filed Apr. 30, 2009.

*Primary Examiner* — Dameon E Levi
*Assistant Examiner* — Collin Dawkins
(74) *Attorney, Agent, or Firm* — Oblon, McClelland, Maier & Neustadt, L.L.P.

(57) ABSTRACT

An antenna device includes an antenna unit, a power supply terminal and a time constant circuit. The antenna unit includes an antenna element and a variable capacitance element that is variable in capacitance in accordance with a voltage applied to the variable capacitance element, and resonates in such a manner that the antenna element and the variable capacitance element cooperate with each other. The power supply terminal supplies the voltage applied to the variable capacitance element. The time constant circuit gradually increases the voltage applied to the variable capacitance element when a voltage applied to the power supply terminal is changed from an off state to an on state.

11 Claims, 8 Drawing Sheets

(51) Int. Cl.
*H03J 3/18* (2006.01)
*H03K 17/60* (2006.01)
*H04B 1/04* (2006.01)

(56) References Cited

U.S. PATENT DOCUMENTS

| | | | |
|---|---|---|---|
| 2001/0054979 A1 | 12/2001 | Bahr et al. | |
| 2003/0067413 A1* | 4/2003 | Ota et al. | 343/702 |
| 2004/0027288 A1 | 2/2004 | Okubora et al. | |
| 2005/0184922 A1* | 8/2005 | Ida et al. | 343/861 |
| 2005/0219132 A1* | 10/2005 | Charrat | 343/745 |
| 2006/0097918 A1 | 5/2006 | Oshiyama et al. | |
| 2006/0279469 A1* | 12/2006 | Adachi et al. | 343/767 |
| 2008/0079640 A1* | 4/2008 | Yang | 343/702 |
| 2008/0079650 A1* | 4/2008 | Constantinidis et al. | 343/858 |
| 2009/0023396 A1 | 1/2009 | Yamazaki et al. | |

FOREIGN PATENT DOCUMENTS

| | | |
|---|---|---|
| EP | 1 885 022 | 2/2008 |
| JP | 2002 76750 | 3/2002 |
| JP | 2003 142928 | 5/2003 |

\* cited by examiner

ANTENNA DEVICE

BACKGROUND OF THE INVENTION

1. Field of the Invention

The invention relates to an antenna device and, more particularly, to an antenna device having a circuit that switches the characteristic of an antenna.

2. Description of the Related Art

In a related art, there is an antenna device that adjusts the resonant frequency by changing a voltage applied to a varicap diode to thereby switch the frequency of radio waves that are transmitted or received. In an antenna device that includes an antenna element and a resonant circuit formed of a varicap diode and an inductor, where the capacitance of the varicap diode is "C", and the inductance of the inductor is "L", the resonant frequency $f_{RES}$ is expressed as follows.

$$f_{RES}=1/\{2\pi(L \cdot C)^{1/2}\}$$

Here, the capacitance C of the varicap diode varies with a voltage applied to the varicap diode. As the voltage increases, the capacitance C decreases. Thus, the resonant frequency of the antenna device may be changed by utilizing the characteristic such that, by increasing the voltage, the capacitance C decreases and, therefore, the resonant frequency $f_{RES}$ increases.

Japanese Patent Application Publication No. 2002-76750 (JP-A-2002-76750), for example, describes an antenna device of which the resonant frequency is variable using the varicap diode. In JP-A-2002-76750, as shown in FIG. 9, the antenna device includes an antenna conductor 35 and an LC parallel resonant circuit 34, which are connected in series with each other. The LC parallel resonant circuit 34 has an inductor 32 and a varicap diode 31. When a voltage is applied to a voltage input terminal 33, the voltage is applied to the varicap diode 31, and then the capacitance of the varicap diode 31 varies. Thus, the resonant frequency is variable.

However, in the resonant antenna of which the resonant frequency is variable using the varicap diode according to the related art, it is necessary to apply the varicap diode with an appropriate voltage corresponding to a resonant frequency. That is, in accordance with the frequency of radio waves that are intended to be transmitted or received, a voltage applied to the varicap diode needs to be controlled to an appropriate value. Thus, an additional device for controlling a voltage applied to the varicap diode is necessary. This increases the size of the antenna device and, as a result, increases manufacturing costs.

SUMMARY OF THE INVENTION

The invention provides an antenna device that is able to carry out communications by switching a transmit frequency or a receive frequency between two frequency bands with a simple low-cost control method.

A first aspect of the invention provides an antenna device. The antenna device performs at least one of transmission of radio waves in a first frequency band and radio waves in a second frequency band that is lower in frequency than the first frequency band or reception of radio waves in the first frequency band and radio waves in the second frequency band. That is, the antenna device transmits and/or receives radio waves in a first frequency band and radio waves in a second frequency band that is lower in frequency than the first frequency band (two different frequency bands). The antenna device according to the first aspect includes an antenna unit, a power supply terminal and a time constant circuit. The antenna unit includes an antenna element and a variable capacitance element that is variable in capacitance in accordance with a voltage applied to the variable capacitance element. The antenna unit resonates in such a manner that the antenna element and the variable capacitance element cooperate with each other. The power supply terminal supplies the voltage applied to the variable capacitance element. The time constant circuit gradually increases the voltage applied to the variable capacitance element when a voltage applied to the power supply terminal is changed from an off state to an on state.

According to the antenna device of the first aspect, the antenna device is able to transmit or receive radio waves in a first frequency band and radio waves in a second frequency band that is lower in frequency than the first frequency band (two different frequency bands) by controlling the on and off states of a voltage applied to the power supply terminal. That is, when the voltage applied to the power supply terminal is changed from an off state to an on state, the voltage applied to the variable capacitance element gradually increases by the time constant circuit. Thus, immediately after the voltage applied to the power supply terminal turns on, the voltage applied to the variable capacitance element is low and, therefore, the antenna unit resonates at a resonant frequency corresponding to that voltage. On the other hand, as a sufficient period of time has elapsed since the voltage applied to the power supply terminal turns on, the voltage applied to the variable capacitance element increases and, therefore, the antenna unit resonates at a resonant frequency corresponding to that voltage. Thus, only a simple control for switching between the on and off states of the voltage applied to the power supply terminal is required. Hence, the antenna device may be simplified, and it is possible to provide the antenna device that is able to switch a transmit frequency or a receive frequency between two different frequency bands with low cost.

In the antenna device according to the first aspect, the time constant circuit may include a resistor and a capacitor that are connected in series. One end of each of the resistor and the capacitor may be connected to a node of the variable capacitance element and the antenna element, the other end of the capacitor may be grounded, and the other end of the resistor may be connected to the power supply terminal.

According to the above antenna device of the first aspect, when the power supply terminal is turned on, it is possible to gradually increase the voltage applied to the variable capacitance element. Thus, the antenna device is able to transmit or receive low-frequency radio waves.

The antenna device according to the first aspect may further include a discharge unit that discharges electric charge stored in the capacitor when the voltage applied to the power supply terminal is changed from the on state to the off state.

According to the above antenna device of the first aspect, it is possible to rapidly discharge electric charge stored in the capacitor. Thus, it is possible to easily switch the resonant frequency from a high frequency to a low frequency.

In the antenna device according to the first aspect, the discharge unit may include a PNP transistor. A base terminal of the PNP transistor may be connected to the power supply terminal. An emitter terminal of the PNP transistor may be connected to a node of the capacitor and the resistor. A collector terminal of the PNP transistor may be grounded.

According to the antenna device of the first aspect, when the voltage applied to the power supply terminal is changed from an on state to an off state, it is possible to rapidly discharge electric charge stored in the capacitor.

In the antenna device according to the first aspect, the time constant circuit may further include at least one resistor that is connected in parallel with the capacitor.

According to the antenna device of the first aspect, it is possible to divide the voltage applied to the power supply terminal with the resistor. Thus, it is possible to easily set the resonant frequency in the first frequency band and the resonant frequency in the second frequency band that is lower in frequency than the first frequency band to respective selected values.

In the antenna device according to the first aspect, the time constant circuit may have a time constant that is longer than a duration during which the radio waves in the second frequency band are transmitted or received.

According to the antenna device of the first aspect, it is possible to transmit or receive radio waves in the second frequency band, which is lower in frequency than the first frequency band, without interrupting communications.

In the antenna device of the first aspect, the voltage applied to the power supply terminal may be equal to a voltage applied to a transmitting circuit or receiving circuit connected to the antenna device.

According to the antenna device of the first aspect, it is not necessary to additionally provide a device that controls the voltage applied to the power supply terminal. Thus, it is possible to achieve a simple and low-cost antenna device.

In the antenna device according to the first aspect, the variable capacitance element may be a varicap diode.

According to the antenna device of the first aspect, the electrostatic capacitance may be easily varied by changing the voltage, so it is possible to simplify the antenna device.

In the antenna device according to the first aspect, the antenna device may be able to continuously transmit or receive the radio waves in the second frequency band by repeatedly switching between the on and off states of the voltage applied to the power supply terminal.

According to the antenna device of the first aspect, it is possible to fix the resonant frequency to a low frequency.

In the antenna device according to the first aspect, the antenna device may be able to continuously transmit or receive the radio waves in the first frequency band in such a manner that the on state of the voltage applied to the power supply terminal is continued for a period of time that is longer than a time constant of the time constant circuit.

According to the antenna device of the first aspect, it is possible to fix the resonant frequency to a high frequency.

In the antenna device according to the first aspect, the antenna device may be able to transmit or receive the radio waves in the first frequency band in such a manner that the on state of the voltage applied to the power supply terminal is continued for a period of time that is longer than a time constant of the time constant circuit, and may be able to transmit or receive the radio waves in the second frequency band in such a manner that the voltage applied to the power supply terminal is turned off from the on state and is then turned on again.

According to the antenna device of the first aspect, it is possible to easily switch the resonant frequency from a high frequency to a low frequency.

A second aspect of the invention provides an antenna device. The antenna device includes an antenna element, a switching element, a power supply terminal, and a time constant circuit. The switching element is connected between one end of the antenna element and a ground. The power supply terminal supplies a voltage applied to the switching element. The time constant circuit gradually increases the voltage applied to the switching element when a voltage applied to the power supply terminal is changed from an off state to an on state. The switching element blocks a high frequency immediately after the voltage applied to the power supply terminal is changed from the off state to the on state, and passes the high frequency when a period of time that is longer than a time constant of the time constant circuit has elapsed.

According to the antenna device of the second aspect, by switching the voltage, applied to the power supply terminal, between an on state and an off state, it is possible to change the antenna characteristic (directivity of an antenna). That is, when the voltage applied to the power supply terminal is turned on, the voltage applied to the switching element gradually increases by the time constant circuit. Immediately after the voltage applied to the power supply terminal turns on, the voltage applied to the switching element is low, so one end of the antenna element is in an electrically open state. On the other hand, as a sufficient period of time has elapsed since the voltage applied to the power supply terminal turns on, the voltage applied to the switching element increases, and one end of the antenna element is in a grounded state. Thus, the antenna characteristic is changed. In this way, by switching the voltage applied to the power supply terminal between an on state and an off state, it is possible to change the antenna characteristic of the antenna device.

In the antenna device according to the second aspect, the antenna element may be a half-loop antenna element.

According to the antenna device of the second aspect, by turning on/off the voltage applied to the power supply terminal, the antenna device has two different antenna characteristics. That is, immediately after the voltage applied to the power supply terminal is turned on, the antenna device has the antenna characteristic of an inverse F-antenna or an inverse L-antenna. In addition, after a sufficient period of time has elapsed, the antenna device has the antenna characteristic of a loop antenna.

In the antenna device according to the second aspect, the time constant circuit may include a resistor and a capacitor that are connected in series. One end of each of the resistor and the capacitor may be connected to a node of the switching element and the antenna element. The other end of the capacitor may be grounded, and the other end of the resistor is connected to the power supply terminal.

According to the antenna device of the second aspect, when the voltage applied to the power supply terminal is turned on, the voltage applied to the switching element may be gradually increased.

The antenna device of the second aspect may further include a discharge unit that discharges electric charge stored in the capacitor when the voltage applied to the power supply terminal is changed from the on state to the off state.

According to the above antenna device of the second aspect, it is possible to rapidly discharge electric charge stored in the capacitor. Thus, it is possible to easily switch the antenna characteristic from the loop antenna to the inverse L-antenna or inverse F-antenna.

In the antenna device according to the second aspect, the discharge unit may include a PNP transistor. At this time, a base terminal of the PNP transistor may be connected to the power supply terminal. An emitter terminal of the PNP transistor may be connected to a node of the capacitor and the resistor. A collector terminal of the PNP transistor may be grounded.

According to the antenna device of the second aspect, when the voltage applied to the power supply terminal is changed from the on state to the off state, it is possible to rapidly discharge electric charge stored in the capacitor.

In the antenna device according to the second aspect, the switching element may be a pin diode.

According to the antenna device of the second aspect, by controlling the on and off states of the voltage applied to the power supply terminal, it is possible to switch between short-circuit and open of one end of the antenna element.

In the antenna device according to the second aspect, the switching element may be a switching diode.

According to the above antenna device of the second aspect, it is possible to reduce costs by using a cheap element as the switching element.

In the antenna device according to the second aspect, the voltage applied to the power supply terminal may be repeatedly switched between the on state and the off state when the antenna characteristic of an inverse L-antenna or an inverse F-antenna is required.

According to the above antenna device of the second aspect, the antenna characteristic of the antenna device may be fixed to the antenna characteristic of an inverse L-antenna or an inverse F-antenna.

In the antenna device according to the second aspect, the voltage applied to the power supply terminal may be continuously turned on for a period of time that is longer than a time constant of the time constant circuit when the antenna characteristic of a loop antenna is required.

According to the above antenna device of the second aspect, the antenna characteristic of the antenna device may be fixed to the antenna characteristic of a loop antenna.

According to the aspects of the invention, it is possible to provide an antenna device that switches the resonant frequency or the antenna characteristic by controlling the on and off states of the voltage applied to the power supply terminal. There is no need to provide control means that minutely controls the level of the voltage applied to the power supply terminal, and only a simple control for switching between the on and off states of the voltage applied to the power supply terminal is required. Thus, it is possible to achieve a simple, low-cost antenna device.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

Figure 1:
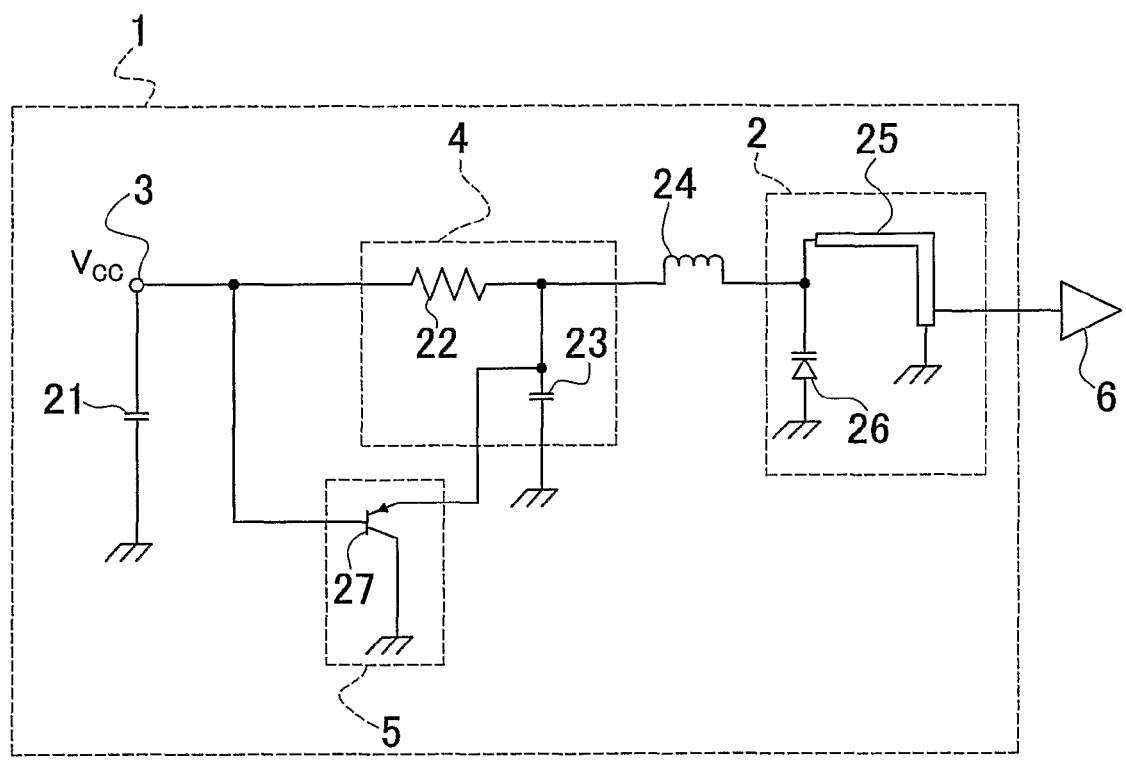
FIG. 1 is a view that shows the configuration of an antenna device according to a first embodiment of the invention.

Hereinafter, a first embodiment of the invention will be described with reference to FIG. 1 to FIG. 6. FIG. 1 is a view that shows the configuration of an antenna device 1 according to the first embodiment. The antenna device 1 according to the present embodiment may be used, for example, in an antenna device for a vehicle.

The antenna device 1 according to the first embodiment shown in FIG. 1 receives radio waves in a relatively high frequency band and radio waves in a relatively low frequency band (two different frequency bands). The antenna device 1 includes an antenna unit 2, a power supply terminal 3, a time constant circuit 4, and a discharge unit 5. The antenna unit 2 has an antenna element 25 and a variable capacitance element 26. Hereinafter, components of the antenna device 1 will be described, and the operation of the antenna device 1 will be described.

The antenna unit 2 has the antenna element 25 and the variable capacitance element 26 that is variable in capacitance in accordance with an applied voltage. The antenna unit 2 resonates in such a manner that these antenna element 25 and variable capacitance element 26 cooperate with each other. In the present embodiment, a varicap diode is used as the variable capacitance element 26. One end of the antenna element 25 is connected to one end of the variable capacitance element 26. The other end of the variable capacitance element 26 is grounded. A node of the antenna element 25 and the variable capacitance element 26 is connected through an inductor 24 to a node of a resistor 22 and a capacitor 23. A receiving circuit 6 is connected to the antenna unit 2 and receives radio waves transmitted from the outside through the antenna unit 2. Note that the inductance of the antenna element 25 is denoted by $L_A$ (H), and the electrostatic capacitance of the variable capacitance element 26 is denoted by $C_0$ (F).

The antenna unit 2 resonates by the antenna element 25 and the variable capacitance element 26 as described above. Instead, another inductor (not shown) may be further connected in parallel with the variable capacitance element 26 to cause the antenna unit 2 to resonate. The antenna element 25 may employ various types of antenna, such as a dipole antenna, a loop antenna or a microstrip antenna. In addition, the variable capacitance element 26 may employ any elements as long as the capacitance of the element is variable in accordance with a voltage.

Figure 3:
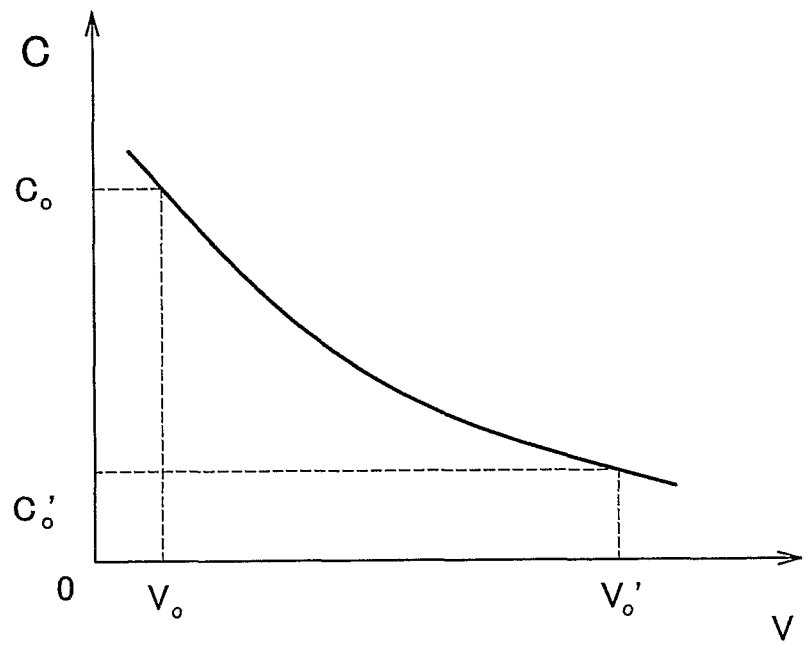
FIG. 3 is a graph that schematically shows the relationship between a voltage applied to a variable capacitance element and an electrostatic capacitance of the variable capacitance element according to the first embodiment.

Here, the relationship between a voltage applied to the variable capacitance element 26 and the resonant frequency of the antenna device 1 will be described with reference to FIG. 3. FIG. 3 is a graph that schematically shows the relationship between a voltage V applied to the variable capacitance element 26 and an electrostatic capacitance C of the variable capacitance element 26.

As is apparent from FIG. 3, the electrostatic capacitance C of the variable capacitance element 26 decreases with an increase in the applied voltage V. Where the electrostatic capacitance of the variable capacitance element 26 is $C_0$ (F) when a voltage of $V_0$ (V) is applied to the variable capacitance element 26, the resonant frequency $f_{RES}$ of the antenna device 1 is calculated from the following expression.

$$f_{RES}=1/\{2\pi(L_A\cdot C_0)^{1/2}\}$$

Here, as the voltage of the variable capacitance element 26 increases to $V_0'$ (V), the electrostatic capacitance of the variable capacitance element 26 decreases to $C_0'$ (F). The resonant frequency $f_{RES}'$ of the antenna device 1 is then calculated from the following expression.

$$f_{RES}'=1/\{2\pi(L_A\cdot C_0')^{1/2}\}$$

Thus, the resonant frequency $f_{RES}'$ is higher than that when the voltage applied to the variable capacitance element 26 is $V_0$ (V). That is, by increasing the voltage V applied to the variable capacitance element 26, the resonant frequency of the antenna device 1 may be increased.

The power supply terminal 3 supplies a voltage applied to the variable capacitance element 26. The power supply terminal 3 is supplied with a voltage from a voltage supply source (for example, in-vehicle battery) (not shown) and is able to switch between the on and off states of the voltage. When the voltage is turned on, a voltage Vcc (V) is supplied from the voltage power source, whereas, when the voltage is turned off, the power supply terminal 3 is set to 0 (V). In the present embodiment, the voltage Vcc (V) is equal to a voltage supplied to the receiving circuit 6. That is, the receiving circuit 6 and the power supply terminal 3 are supplied with the same power supply voltage. Thus, when radio waves need to be received, the receiving circuit 6 is turned on, while the voltage applied to the power supply terminal 3 is also turned on at the same time. When no radio waves need to be received, the receiving circuit 6 is turned off, while the voltage applied to the power supply terminal 3 is also turned off.

The time constant circuit 4 gradually increases a voltage applied to the variable capacitance element 26 when the voltage applied to the power supply terminal 3 is changed from the off state to the on state. The time constant circuit 4 has the resistor 22 and the capacitor 23 that are connected in series. One end of each of the resistor 22 and the capacitor 23 is connected to the node of the variable capacitance element 26 and the antenna element 25 through the inductor 24. The other end of the capacitor 23 is grounded. The other end of the resistor 22 is connected to the power supply terminal 3. Note that the resistance of the resistor 22 is $R_1$ (Ω), and the electrostatic capacitance of the capacitor 23 is $C_1$ (F). The time constant $\tau_1$ (sec) of the thus configured RC circuit may be calculated as follows.

$$\tau_1=R_1\cdot C_1$$

Here, the time constant $\tau_1$ represents the speed of response of the circuit, and represents a period of time from the instant at which a voltage is applied until the voltage reaches about 63.2 percent of a steady-state value.

Figure 2:
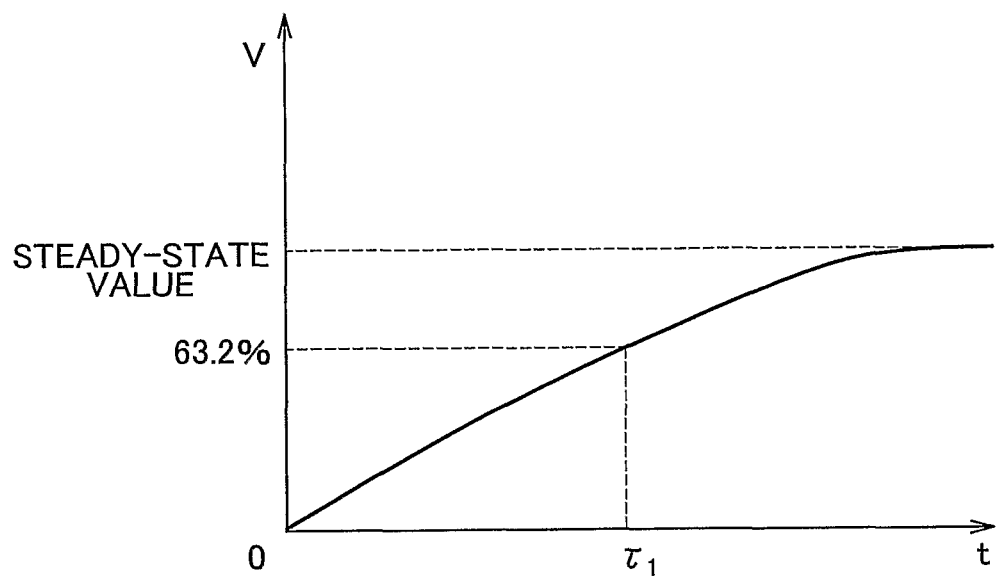
FIG. 2 is a graph that schematically shows a change in voltage applied to a capacitor over time according to the first embodiment.

FIG. 2 is a graph that schematically shows a change in voltage applied to the capacitor 23 during a period from the instant at which the voltage applied to the power supply terminal 3 turns on until the voltage attains a steady-state value. The abscissa axis represents time t, and the ordinate axis represents a voltage V applied to the capacitor 23. As shown in FIG. 2, the voltage applied to the capacitor 23 gradually increases from the instant at which the voltage applied to the power supply terminal 3 turns on and finally attains a steady-state value. The time constant $\tau_1$ represents a period of time until the voltage attains about 63.2 percent of the steady-state value. Thus, with the time constant circuit 4, the voltage applied to the capacitor 23 is gently increased and, therefore, a period of time that is taken until the voltage attains the steady-state value may be prolonged. That is, with the time constant circuit 4, the voltage applied to the variable capacitance element 26 is gently increased and, therefore, a period of time that is taken until the voltage attains the steady-state value may be prolonged.

In the present embodiment, the time constant circuit 4 is formed of the RC circuit that uses the resistor 22 and the capacitor 23. Instead, the time constant circuit 4 may be formed of an RL circuit that uses a resistor and an inductor (not shown).

The discharge unit 5 discharges electric charge stored in the capacitor 23 when the voltage applied to the power supply terminal 3 is changed from the on state to the off state. The discharge unit 5 is formed of a PNP transistor 27. As shown in FIG. 1, the emitter terminal of the PNP transistor 27 is connected to the node of the resistor 22 and the capacitor 23, and the collector terminal of the PNP transistor 27 is grounded. In addition, the base terminal of the PNP transistor 27 is connected to the power supply terminal 3. Electric charge is gradually stored into the capacitor 23 from the instant at which the voltage of the power supply terminal 3 is turned on. As a sufficient period of time has elapsed, electric charge is fully stored in the capacitor 23. Subsequently, when the voltage applied to the power supply terminal 3 is changed from the on state to the off state, the voltage applied to the base terminal of the PNP transistor 27 decreases and, as a result, the PNP transistor 27 turns on. Then, the electric charge stored in the capacitor 23 is discharged through the PNP transistor 27 to the ground. In this way, when the voltage applied to the power supply terminal 3 is turned off, electric charge stored in the capacitor 23 may be rapidly discharged.

The foregoing is the description of the components of the antenna device 1. Note that in the antenna device 1 according to the first embodiment, as shown in FIG. 1, a capacitor 21 is connected between the power supply terminal 3 and the ground for decoupling the power supply terminal 3. In addition, the inductor 24, which holds a high impedance at the resonant frequency of the antenna unit 2, is connected between the time constant circuit 4 and the antenna unit 2 so that radio waves received at the antenna unit 2 are efficiently led to the receiving circuit 6.

Next, the operation of switching the resonant frequency of the antenna device 1 will be described with reference to FIG. 4 to FIG. 6.

Figure 4:
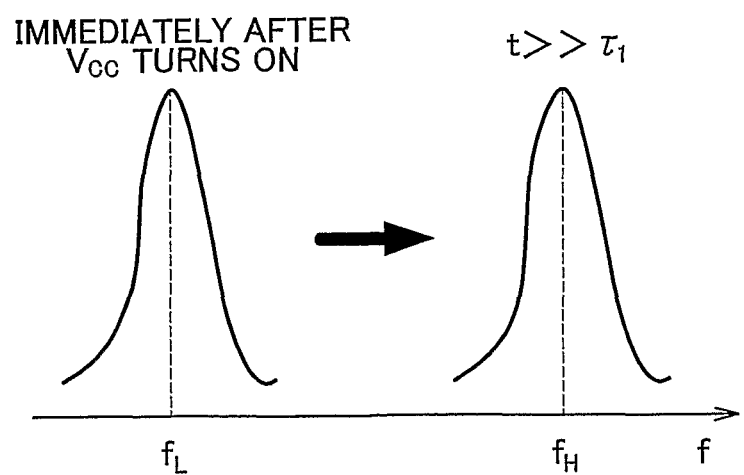
FIG. 4 is a graph that shows a change in resonant frequency from the time immediately after the voltage applied to a power supply terminal is turned on until a sufficient period of time elapses according to the first embodiment.

FIG. 4 is a graph that shows a change in resonant frequency from the time immediately after the voltage applied to the power supply terminal 3 is turned on until a sufficient period of time elapses. When the voltage applied to the power supply terminal 3 is changed from the off state to the on state, as described above, the voltage applied to the variable capacitance element 26 gradually increases by the time constant circuit 4 and finally attains approximately Vcc (V). Immediately after the voltage applied to the power supply terminal 3 is turned on (see the left-side graph in FIG. 4), the voltage applied to the variable capacitance element 26 is low as described above, so the resonant frequency of the antenna device 1 is low. The low resonant frequency is $f_L$ immediately after the voltage applied to the power supply terminal 3 is turned on. As a sufficient period of time relative to the time constant $\tau_1$ has elapsed since the voltage applied to the power supply terminal 3 is turned on (see the right-side graph in FIG. 4), the voltage applied to the variable capacitance element 26 increases to approximately Vcc (V), so the resonant frequency of the antenna device 1 is high. The high resonant frequency is $f_H$ when the voltage applied to the power supply terminal 3 is turned on, a sufficient period of time has elapsed and then the voltage applied to the variable capacitance element 26 attains approximately Vcc (V). As shown in FIG. 4, immediately after the voltage applied to the power supply terminal 3 is turned on, the resonant frequency is the low frequency $f_L$. A sufficient period of time has elapsed since the voltage applied to the power supply terminal 3 is turned on, and then the resonant frequency is the high frequency $f_H$. During a period from the time immediately after the voltage applied to the power supply terminal 3 is turned on until a sufficient period of time elapses, the resonant frequency continuously varies from $f_L$ to $f_H$.

Next, a method of maintaining the resonant frequency of the antenna device 1 at the low frequency $f_L$ will be described. When the voltage applied to the power supply terminal 3 is in the off state, and when electric charge is not stored in the capacitor 23 of the time constant circuit 4, this state is called an initial state. Immediately after the voltage of the power supply terminal 3 is turned on from the initial state, the resonant frequency of the antenna device 1 is the low frequency $f_L$. When the voltage applied to the power supply terminal 3 continues to be turned on, electric charge is gradually stored into the capacitor 23 as described above. Then the voltage applied to the variable capacitance element 26 increases and, therefore, the resonant frequency increases. Here, when the voltage applied to the power supply terminal 3 is changed from the on state to the off state, as described above, electric charge stored in the capacitor 23 is rapidly discharged through the discharge unit 5 and then the antenna device 1 returns to the initial state. When the voltage applied to the power supply terminal 3 is turned on again, the resonant frequency is the low frequency $f_L$. Thus, the voltage applied to the power supply terminal 3 is repeatedly switched between the on and off states in such a manner that the duration of the on voltage of the power supply terminal 3 is short so that the low frequency $f_L$ is maintained. In this manner, the resonant frequency of the antenna device 1 repeatedly increases and decreases around the low frequency $f_L$. That is, in order to maintain the resonant frequency at the low frequency $f_L$, the voltage applied to the power supply terminal 3 may be repeatedly switched between the on and off states so that the duration of the on-voltage of the power supply terminal is shorter than a predetermined first duration. Here, the predetermine first duration is a period of time during which the electrostatic capacitance C of the variable capacitance element 26 substantially does not change from the capacitance immediately after the voltage of the power supply terminal 3 is turned on. The predetermine first duration is, for example, shorter than or equal to about $\tau_1/10$.

Next, a method of maintaining the resonant frequency of the antenna device 1 at the high frequency $f_H$ will be described. As described above, as a sufficient period of time has elapsed since the voltage applied to the power supply terminal 3 is turned on, a voltage of approximately Vcc (V) is applied to the variable capacitance element 26 and then the resonant frequency is $f_H$. In order to maintain the resonant frequency at the high frequency $f_H$, it is only necessary to maintain the state in which the voltage of the power supply terminal 3 is turned on during a period of time that is sufficiently longer than the time constant $\tau_1$.

Furthermore, in order to switch the resonant frequency of the antenna device 1 from the high frequency $f_H$ to the low frequency $f_L$, it is only necessary that the voltage applied to the power supply terminal 3 is changed from the on state to the off state and, thus, electric charge stored in the capacitor 23 of the time constant circuit 4 is rapidly discharged through the discharge unit 5, and then the voltage applied to the power supply terminal 3 is turned on again.

The way of switching the resonant frequency of the antenna device 1 will be described with reference to FIG. 5. FIG. 5 is a view that shows a difference in resonant frequency depending on a difference in the way of switching between the on and off states of the voltage applied to the power supply terminal 3. The abscissa axis represents time, and the ordinate axis represents a voltage applied to the power supply terminal 3. Note that the duration during which the voltage applied to the power supply terminal 3 is in the on state is td. As shown in FIG. 5, when td is sufficiently shorter than the time constant $\tau_1$ of the time constant circuit 4, and when the on and off states of the voltage applied to the power supply terminal 3 are repeatedly switched, the antenna device 1 is able to continuously receive radio waves of the low frequency $f_L$.

Figure 5:
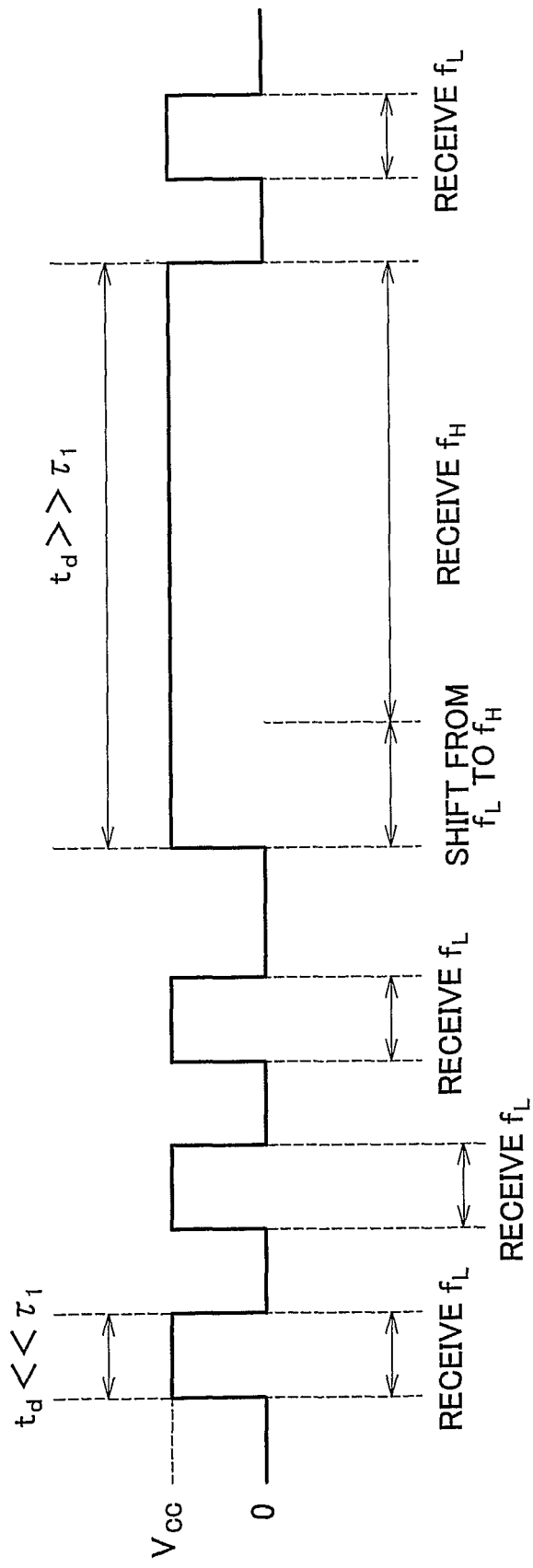
FIG. 5 is a view that shows a difference in resonant frequency depending on a difference in the way of switching the on and off states of the voltage applied to the power supply terminal according to the first embodiment.

In addition, as shown in FIG. 5, when the duration during which the voltage of the power supply terminal 3 is in the on state continues for a sufficiently long period of time, that is, when td is sufficiently longer than the time constant $\tau_1$, the resonant frequency of the antenna device 1 shifts from the low frequency $f_L$ to the high frequency $f_H$, and, after that, the antenna device 1 is able to continuously receive radio waves of the high frequency $f_H$.

Moreover, when the voltage applied to the power supply terminal 3 is turned off from the state in which the resonant frequency is the high frequency $f_H$, electric charge stored in the capacitor 23 of the time constant circuit 4 is discharged through the discharge unit 5 as described above. As shown in FIG. 5, when the voltage applied to the power supply terminal 3 is turned on again, the resonant frequency is the low frequency $f_L$.

Next, an example of application of the antenna device 1 according to the first embodiment will be described. The antenna device 1 according to the first embodiment is, for example, used to receive radio waves in a smart entry system and a tire pressure monitoring system (TPMS) mounted on a vehicle. FIG. 6 is a view that shows the voltage applied to the power supply terminal 3 when the antenna device 1 is used in the smart entry system and the TPMS.

The smart entry system transmits radio waves from a key, which is able to transmit and receive radio waves, to the in-vehicle antenna device 1 to thereby lock or unlock a vehicle door. On the other hand, the TPMS transmits radio waves from sensors, attached to tires, to the antenna device 1 mounted on the vehicle to thereby transmit the pressure information of the tires to the vehicle while the vehicle is traveling.

In the present embodiment, the frequency band of radio waves used in the smart entry system is lower in frequency than the frequency band of radio waves used in the TPMS. That is, the inductance $L_A$ (H) of the antenna element 25 and the capacitance $C_0$ (F) of the variable capacitance element 26 in the antenna device 1 are set so that the frequency used in the smart entry system is the low frequency $f_L$ of the antenna device 1 and the frequency used in the TPMS is the high frequency $f_H$ of the antenna device 1.

The receiving circuit 6 of the smart entry system needs to be able to receive radio waves from the key while the engine of the vehicle is stopped. However, when the voltage applied to the receiving circuit 6 is constantly in the on state during stop of the engine, power consumption of a battery increases. Then, in the present embodiment, the receiving circuit 6 is repeatedly turned on/off at predetermined time intervals while the engine of the vehicle is stopped. By controlling the voltage applied to the receiving circuit 6 in this manner, it is possible to reduce power consumption of the battery during stop of the engine.

As described above, in the antenna device 1 according to the present embodiment, the voltage applied to the receiving circuit 6 is equalized to the voltage applied to the power supply terminal 3, and the voltage applied to the power supply terminal 3 is supplied through the time constant circuit 4 to the antenna unit 2. Thus, without any additional circuit for controlling the on and off states of the voltage applied to the power supply terminal 3, it is possible to maintain the state in which the antenna device 1 is able to continuously receive radio waves from the key.

Figure 6:
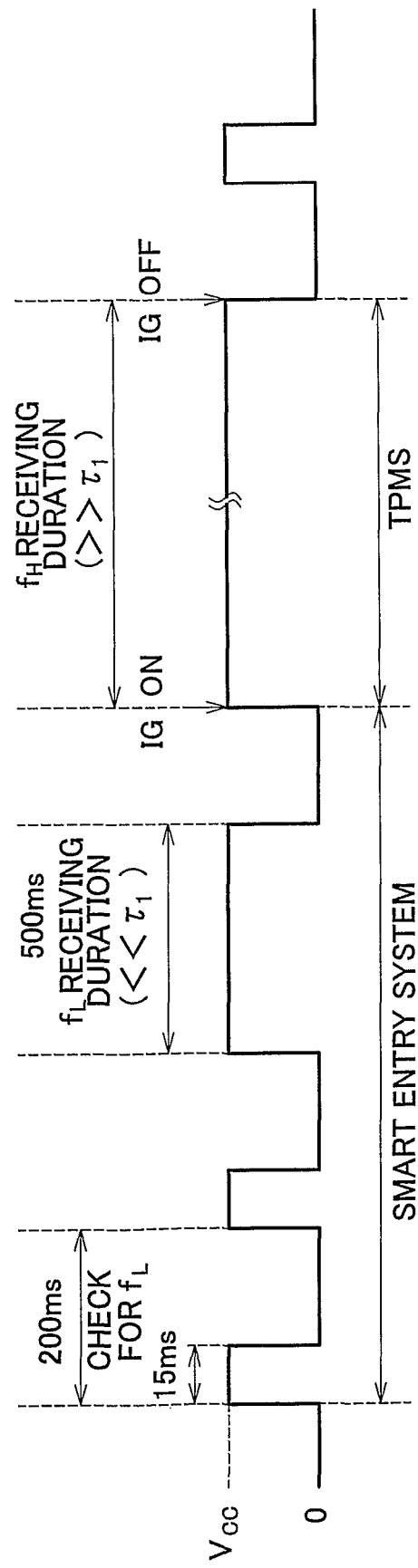
FIG. 6 is a view that shows the voltage applied to the power supply terminal when the antenna device is used in a smart entry system and a tire pressure monitoring system (TPMS)

For example, as shown in FIG. 6, the voltage applied to the power supply terminal 3 is turned on at time intervals of 200 ms to allow the antenna device 1 to receive radio waves from the key. When no radio waves are transmitted from the key, the voltage applied to the power supply terminal 3 is, for example, turned on for 15 ms and then turned off. In this way, by repeatedly switching the on and off states of the voltage applied to the power supply terminal 3 at predetermined time intervals, it is possible to receive radio waves of the frequency used in the smart entry system. When radio waves are transmitted from the key, the voltage applied to the power supply terminal 3 is, for example, turned on for 500 ms. Here, the time constant of the time constant circuit 4 is set so as to be sufficiently longer than the maximum duration from the time at which communication in the smart entry system is initiated until the communication is complete. That is, the resistance of the resistor 22 and the electrostatic capacitance of the capacitor 23 in the time constant circuit 4 are set so that the time constant $\tau_1$ is sufficiently longer than the maximum duration of communication that occurs in the smart entry system. For example, $\tau_1$ may be set to 10 (sec).

Subsequently, when the engine of the vehicle is started (when the ignition is turned on), the voltage applied to the power supply terminal 3 is turned on and then the on-voltage state is maintained. When a sufficient period of time has elapsed since the voltage applied to the power supply terminal 3 is turned on (for example, when one minute has elapsed), the antenna device 1 resonates at the high frequency $f_H$ and is able to receive radio waves used in the TPMS. Because the TPMS needs to regularly monitor the pressure information of the tires during vehicle traveling, the voltage applied to the power supply terminal 3 is maintained in the on state. Note that because the vehicle is traveling, it is not necessary to consider power consumption of the battery. After that, when the engine of the vehicle is stopped (when the ignition is turned off), the voltage applied to the power supply terminal 3 is turned off and then the on and off states of the voltage applied to the power supply terminal 3 are repeatedly switched again. Thus, the antenna device 1 is able to receive the low frequency $f_L$. Note that the antenna device 1 is not able to receive both the high-frequency radio waves and the low-frequency radio waves at the same time; however, this does not matter in the present application example. This is because the smart entry system needs to receive radio waves when the engine is stopped, whereas the TPMS needs to receive radio waves when the vehicle is traveling.

As in the above described manner, the antenna device 1 according to the first embodiment may be used as an in-vehicle antenna device. Note that two types of radio waves that the antenna device 1 according to the first embodiment is able to receive are not limited to the radio waves used in the smart entry system and the TPMS. In addition, not only the antenna device 1 is used in the in-vehicle antenna device but also it may be, of course, used in other application purposes.

Note that it is also applicable that the antenna device 1 according to the first embodiment does not include the discharge unit 5. However, in this case, because electric charge stored in the capacitor 23 of the time constant circuit 4 cannot be rapidly discharged, electric charge is continuously stored into the capacitor 23 when the voltage applied to the power supply terminal 3 is repeatedly turned on/off at short intervals. For this reason, in order to set the resonant frequency to $f_L$, it is necessary to wait until electric charge stored in the capacitor 23 is discharged over time. Similarly, in order to switch the resonant frequency from the high frequency $f_H$ to the low frequency $f_L$, it is necessary that electric charge stored in the capacitor 23 is discharged over time after the voltage applied to the power supply terminal 3 is turned off, and then the voltage applied to the power supply terminal 3 is turned on again.

In addition, the voltage power source that supplies a voltage to the power supply terminal 3 may be a power source other than the in-vehicle battery. Furthermore, the voltage applied to the power supply terminal 3 is equalized to the voltage applied to the receiving circuit 6 in the first embodiment. Instead, these voltages may be different from each other. When the voltage applied to the power supply terminal 3 differs from the voltage applied to the receiving circuit 6, the on and off states of the voltages applied respectively to the receiving circuit 6 and the power supply terminal 3 are separately controlled. Even when the voltage applied to the power supply terminal 3 is turned off, when the voltage applied to the receiving circuit 6 is turned on, it is possible to receive radio waves of the low frequency $f_L$.

Figure 7:
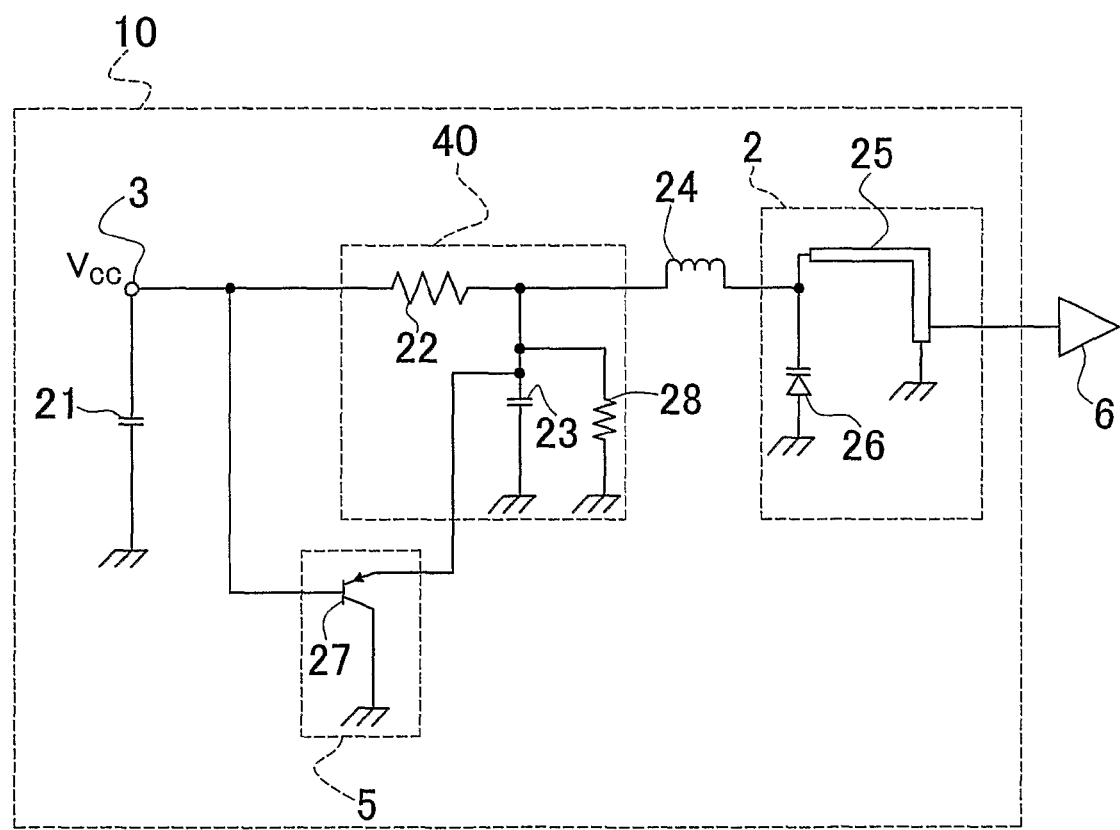
FIG. 7 is a view that shows the configuration of an antenna device according to a second embodiment of the invention.

Next, a second embodiment of the invention will be described. FIG. 7 is a view that shows the configuration of an antenna device 10 according to the second embodiment. The antenna device 10 according to the second embodiment differs from the antenna device 1 according to the first embodiment in that the time constant circuit 4 is replaced with a time constant circuit 40 as shown in FIG. 7, and the other components have similar configuration to those of the first embodiment. Therefore, like reference numerals denote like components to those of the antenna device 1 according to the first embodiment, and the description thereof is omitted.

As shown in FIG. 7, in the antenna device 10 according to the second embodiment, the time constant circuit 40 further includes at least one resistor 28 that is connected in parallel with the capacitor 23. As shown in FIG. 7, one end of the resistor 28 is connected to the node of the capacitor 23 and the resistor 22. The other end of the resistor 28 is grounded. The antenna device 10 according to the second embodiment includes the resistor 28 to thereby divide the voltage Vcc (V) applied to the power supply terminal 3. Thus, the voltage applied to the variable capacitance element 26 may be set to a selected value and, therefore, it is possible to selectively set the resonant frequency.

Note that the resistance of the resistor 28 is denoted by $R_2$ ($\Omega$), the resistance of the resistor 22 is denoted by $R_1$ ($\Omega$), and the electrostatic capacitance of the capacitor 23 is denoted by $C_1$ (F). The time constant $\tau_2$ (sec) of the thus configured time constant circuit 4 is calculated from the following expression.

$$\tau_2 = R_1 \cdot R_2 \cdot C_1/(R_1+R_2)$$

The voltage Vcc (V) is applied to the power supply terminal 3, and, after a period of time that is sufficiently longer than the time constant $\tau_2$, a voltage Vn (V) applied to the variable capacitance element 26 is as follows.

$$Vn = R_2 \cdot Vcc/(R_1+R_2)$$

In this case, the electrostatic capacitance of the variable capacitance element 26 is a value Cn (F) corresponding to the voltage Vn. In this case, the resonant frequency fn of the antenna device 10 is expressed as follows.

$$fn = 1/\{2\pi(L_A \cdot Cn)^{1/2}\}$$

Thus, the resonant frequency of the antenna device 10 varies in accordance with the resistance R2 of the resistor 28.

As described above, with the resistor 28, the resonant frequency fn may be selectively set. In the case of the antenna device 1 according to the first embodiment shown in FIG. 1, the high and low resonant frequencies are determined through selection of the antenna element 25 and the variable capacitance element 26. On the other hand, in the antenna device 10 according to the second embodiment, with the resistor 28, a desired resonant frequency fn may be obtained. That is, even when the characteristics of the antenna element 25 and variable capacitance element 26 are not adjusted, by adjusting the resistance of the resistor 28, it is possible to easily set the resonant frequencies.

Furthermore, by using a variable resistor as the resistor 28, two resonant frequencies may be variable. The variable resistor may be manually variable or may be automatically switched between predetermined values.

Note that in the present embodiment, one resistor 28 is connected in parallel with the capacitor 23; instead, a plurality of resistors may be connected in parallel with the capacitor 23.

Figure 8:
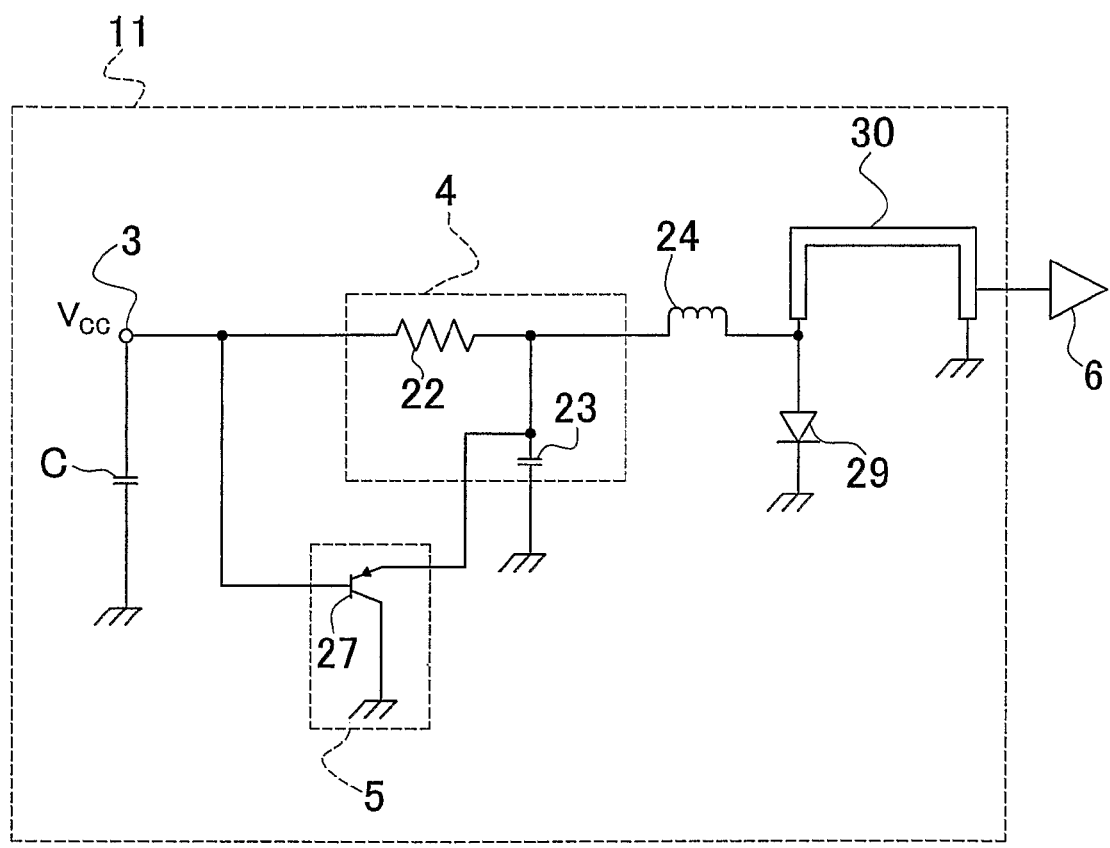
FIG. 8 is a view that shows the configuration of an antenna device according to a third embodiment of the invention.
Figure 9:
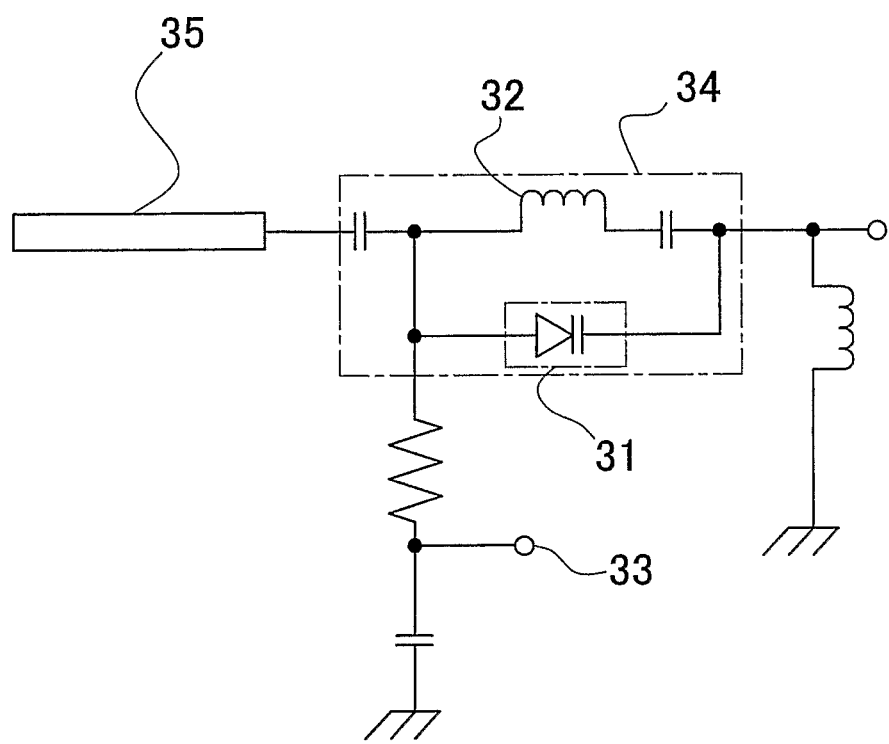
FIG. 9 is a view that shows the configuration of an antenna device according to the related art.

Next, a third embodiment will be described. FIG. 8 is a view that shows the configuration of an antenna device 11 according to the third embodiment.

As shown in FIG. 8, the antenna device 11 according to the third embodiment includes an antenna element 30, a switching element 29, a power supply terminal 3, a time constant circuit 4, and a discharge unit 5. The antenna device 11 according to the third embodiment differs from the antenna device 1 according to the first embodiment shown in FIG. 1 in that the antenna element 25 and the variable capacitance element 26 are respectively replaced. That is, the antenna element 25 is replaced with the antenna element 30, and the variable capacitance element 26 is replaced with the switching element 29. The other components have similar configuration to those of the first embodiment, so like reference numerals denote like components to those of the antenna device 1 according to the first embodiment, and the description thereof is simplified.

As shown in FIG. 8, in the antenna device 11 according to the third embodiment, the antenna element 30 is a half-loop antenna element. The switching element 29 is connected to one end of the antenna element 30.

Note that a capacitance element (not shown) may be further connected in parallel with the switching element 29 to resonate with the antenna element 30. Furthermore, an inductor (not shown) may be further connected in parallel with the switching element 29 to resonate with the antenna element 30.

The switching element 29 does not pass a high frequency immediately after the voltage applied to the power supply terminal 3 is changed from an off state to an on state, and passes a high frequency when a period of time that is longer than the time constant of the time constant circuit 4 has elapsed. In the present embodiment, the switching element 29 is formed of a pin diode or a switching diode. The anode of the switching element 29 is connected to one end of the antenna element 30, and the cathode of the switching element 29 is grounded.

The thus connected switching element 29 has a high impedance and is turned off when no voltage is applied, and one end of the antenna element 30 is in a substantially open state. In this case, the antenna element 30 operates as an antenna having a directivity similar to an inverse F-antenna of which one end is open. Note that as shown in FIG. 8, in the present embodiment, the other end of the antenna element 30 is grounded; instead, the other end of the antenna element 30 does not need to be grounded. When the other end of the antenna element 30 is not grounded and one end of the antenna element 30 is substantially open, the antenna element 30 becomes an inverse L-antenna.

On the other hand, when a voltage is applied to the switching element 29, the switching element 29 has a low impedance and is in the on state, so one end of the antenna element 30 is in a substantially grounded state. In this case, the antenna element 30 creates a mirror-image antenna with respect to a ground plane and operates as an antenna having a directivity similar to a loop antenna.

The power supply terminal 3 supplies a voltage applied to the switching element 29. As well as the first embodiment, the voltage applied to the power supply terminal 3 is equalized to the voltage applied to the receiving circuit 6, and the on and off states of the voltage is switched.

The time constant circuit 4 gradually increases a voltage applied to the switching element 29 when the voltage applied to the power supply terminal 3 is changed from the off state to the on state. In the third embodiment, the variable capacitance element 26 according to the first embodiment is replaced with the switching element 29. The configuration and operation of the time constant circuit 4 are similar to those of the time constant circuit 4 of the antenna device 1 according to the first embodiment, so the description thereof is omitted. Note that the time constant of the time constant circuit 4 is denoted by $\tau_3$.

Next, switching of the antenna characteristic (directivity of the antenna) by switching between the on and off states of the voltage applied to the power supply terminal 3 will be described.

When the voltage applied to the power supply terminal 3 is turned on, the voltage applied to the switching element 29 gradually increases by the time constant circuit 4. Immediately after the voltage applied to the power supply terminal 3 is turned on, the voltage applied to the switching element 29 is low and, therefore, the switching element 29 is in the off state. Thus, one end of the antenna element 30 is substantially open, and the antenna device 11 has the antenna characteristic of an inverse F-antenna. In order to maintain the antenna characteristic of the antenna device 11 at the antenna characteristic of the inverse F-antenna, it is only necessary to repeatedly switch between the on and off states of the voltage applied to the power supply terminal 3 so that the duration, during which the voltage applied to the power supply terminal 3 is in the on state, is shorter than a predetermined second duration. Here, the predetermined second duration is a duration during which a high impedance of the switching element 29 substantially does not change. The predetermined second duration is, for example, shorter than or equal to about $\tau_3/10$.

On the other hand, as a sufficient period of time has elapsed since the voltage applied to the power supply terminal 3 is turned on, the voltage applied to the switching element 29 is approximately Vcc and, therefore, the switching element 29 turns on. Thus, one end of the antenna element 30 is substantially grounded, and the antenna device 11 has the antenna characteristic of a loop antenna. In order to maintain the antenna characteristic of the antenna device 11 at the antenna characteristic of the loop antenna, it is only necessary that the voltage applied to the power supply terminal 3 is maintained in the on state during a period of time that is sufficiently longer than the time constant $\tau_3$.

Furthermore, in order to switch from the antenna characteristic of the loop antenna to the antenna characteristic of the inverse F-antenna, it is only necessary that the voltage applied to the power supply terminal 3 is turned off and, as a result, electric charge stored in the capacitor 23 of the time constant circuit 4 is rapidly discharged through the discharge unit 5, and then the voltage applied to the power supply terminal 3 is turned on again.

Next, an example of application of the antenna device 11 according to the third embodiment will be described. The antenna device 11 according to the third embodiment is, for example, used in a smart entry system and a TPMS mounted on a vehicle.

In the smart entry system, it is desirable to be able to receive radio waves from a key located at a selected position spaced away from the vehicle. For this reason, an antenna used in the smart entry system is desirably a nondirectional antenna. Thus, when the antenna device 11 is used in the smart entry system, as described above, the on and off states of the voltage applied to the power supply terminal 3 are repeatedly switched at short time intervals so as to have the antenna characteristic of an inverse F-antenna.

On the other hand, in the TPMS, it is necessary to receive radio waves from sensors attached to tires that are fixed in position. For this reason, an antenna used in the TPMS is desirably able to receive radio waves from specific directions. Thus, when the antenna device 11 is used in the TPMS, as described above, the voltage applied to the power supply terminal 3 is maintained in the on state so as to have the antenna characteristic of a loop antenna.

As described above, the antenna device 11 according to the third embodiment is used in the smart entry system and the TPMS that are mounted on the vehicle. Note that application of the antenna device 11 according to the present embodiment is not limited to the above described smart entry system and TPMS; instead, it may be used in various systems that require two different antenna characteristics. In addition, application of the antenna device 11 is not limited to the in-vehicle antenna device; instead, it may be, of course, used for other application purposes.

Note that it is also applicable that the antenna device 11 according to the third embodiment does not include the discharge unit 5 as well as the first embodiment.

In addition, as well as the first embodiment, the voltage power source that supplies a voltage to the power supply terminal 3 may be a power source other than the in-vehicle battery. Furthermore, the voltage applied to the power supply terminal 3 is equalized to the voltage applied to the receiving circuit 6 in the third embodiment. Instead, these voltages may be different from each other.

Note that the antenna devices according to the above embodiments are related to a receiving antenna device; instead, each antenna device may be changed to a transmitting antenna device. For example, by changing the receiving circuit 6 to a transmitting circuit (not shown), it is possible to change the receiving antenna device to a transmitting antenna device.

As described above, in the embodiments of the invention, it is possible to provide an antenna device that changes the resonant frequency or antenna characteristic of an antenna with a simple voltage control. For example, the antenna device may be used as an antenna device mounted on a vehicle.

While the invention has been described with reference to example embodiments thereof, it should be understood that the invention is not limited to the example embodiments or constructions. To the contrary, the invention is intended to cover various modifications and equivalent arrangements. In addition, while the various elements of the example embodiments are shown in various combinations and configurations, which are example, other combinations and configurations, including more, less or only a single element, are also within the spirit and scope of the invention.

The invention claimed is:

1. An antenna device that performs at least one of transmission of radio waves in a first frequency band and radio waves in a second frequency band that is lower in frequency than the first frequency band or reception of radio waves in the first frequency band and radio waves in the second frequency band, comprising:
   an antenna unit that includes an antenna element and a variable capacitance element that is variable in capacitance in accordance with a voltage applied to the variable capacitance element, and that resonates in such a manner that the antenna element and the variable capacitance element cooperate with each other;
   a power supply terminal that supplies the voltage applied to the variable capacitance element;
   a time constant circuit that gradually increases the voltage applied to the variable capacitance element when a voltage applied to the power supply terminal is changed from an off state to an on state, wherein the time constant circuit includes a resistor and a capacitor that are connected in series, one end of each of the resistor and the capacitor is connected to a node of the variable capacitance element and the antenna element, the other end of the capacitor is grounded, and the other end of the resistor is connected to the power supply terminal, and wherein the time constant circuit has a time constant that is longer than a duration during which the voltage applied to the power supply terminal is in an on state; and
   a discharge unit that discharges electric charge stored in the capacitor when the voltage applied to the power supply terminal is changed from the on state to the off state.

2. The antenna device according to claim 1, wherein the discharge unit includes a PNP transistor, a base terminal of the PNP transistor is connected to the power supply terminal, an emitter terminal of the PNP transistor is connected to a node of the capacitor and the resistor, and a collector terminal of the PNP transistor is grounded.

3. The antenna device according to claim 1, wherein the time constant circuit further includes at least one resistor that is connected in parallel with the capacitor.

4. The antenna device according to claim 1, further comprising a transmitting circuit or receiving circuit connected to the antenna unit, wherein the voltage applied to the power supply terminal is equal to a voltage applied to the transmitting circuit or receiving circuit.

5. The antenna device according to claim 1, wherein the variable capacitance element is a varicap diode.

6. A method for operating the antenna device according to claim 1, comprising repeatedly switching between the on and off states of the voltage applied to the power supply terminal to continuously transmit or receive the radio waves in the second frequency band.

7. A method for operating the antenna device according to claim 1, comprising applying the on state of the voltage to the power supply terminal for a period of time that is longer than a time constant of the time constant circuit to continuously transmit or receive the radio waves in the first frequency band.

8. A method for operating the antenna device according to claim 1, comprising applying the on state of the voltage to the power supply terminal for a period of time that is longer than a time constant of the time constant circuit to transmit or receive the radio waves in the first frequency band, and turning the voltage applied to the power supply terminal off from the on state and then turning it on again to transmit or receive the radio waves in the second frequency band.

9. The antenna device according to claim 1, wherein the antenna unit is connected to the time constant circuit through an inductor.

10. An antenna device that performs at least one of transmission of radio waves in a first frequency band and radio waves in a second frequency band that is lower in frequency than the first frequency band or reception of radio waves in the first frequency band and radio waves in the second frequency band, comprising:
  antenna circuitry that includes an antenna element and a variable capacitance element that is variable in capacitance in accordance with a voltage applied to the variable capacitance element, and that resonates in such a manner that the antenna element and the variable capacitance element cooperate with each other;
  a power supply terminal that supplies the voltage applied to the variable capacitance element;
  a time constant circuit that gradually increases the voltage applied to the variable capacitance element when a voltage applied to the power supply terminal is changed from an off state to an on state, wherein the time constant circuit includes a resistor and a capacitor that are connected in series, one end of each of the resistor and the capacitor is connected to a node of the variable capacitance element and the antenna element, the other end of the capacitor is grounded, and the other end of the resistor is connected to the power supply terminal, and wherein the time constant circuit has a time constant that is longer than a duration during which the voltage applied to the power supply terminal is in an on state; and
  discharge circuitry that discharges electric charge stored in the capacitor when the voltage applied to the power supply terminal is changed from the on state to the off state.

11. The antenna device according to claim 10, wherein the antenna circuitry is connected to the time constant circuit through an inductor.

* * * * *